United States Patent
Paschal et al.

(10) Patent No.: US 6,532,245 B1
(45) Date of Patent: Mar. 11, 2003

(54) VERTICAL CAVITY SURFACE EMITTING LASER (VCSEL) DRIVER WITH LOW DUTY CYCLE DISTORTION AND DIGITAL MODULATION ADJUSTMENT

(75) Inventors: Matthew James Paschal, Rochester, MN (US); Steven John Baumgartner, Zumbro Falls, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/429,280

(22) Filed: Oct. 28, 1999

(51) Int. Cl.$^7$ ................................................ H01S 3/00
(52) U.S. Cl. ................................................ 372/38.02
(58) Field of Search .................... 372/38.01, 38.02, 372/38.03, 38.04, 38.07

(56) References Cited

U.S. PATENT DOCUMENTS

| | | | |
|---|---|---|---|
| 3,633,120 A | | 1/1972 | Battjes ........................ 330/271 |
| 4,709,370 A | | 11/1987 | Bednarz et al. .......... 372/38.02 |
| 5,764,667 A | * | 6/1998 | Luque .......................... 372/38 |
| 6,181,191 B1 | * | 1/2001 | Paschal ....................... 327/513 |
| 6,265,857 B1 | * | 7/2001 | Demsky et al. ............. 323/312 |
| 6,272,160 B1 | * | 8/2001 | Stronczer ................. 372/38.02 |

OTHER PUBLICATIONS

"Lasers: harnessing the atom's light"; James P. Harbison et al., 1997, pp. 160–177.

"SA 19.1: A 10Gb/s Si–Bipolar TX/RX Chipset for Computer Data Transmission" by Richard C. Walker et al., ISSCC98/Session19/Multi–Gigahertz Serial Data/Paper SA 19.1, Feb. 7, 1998, 4 pages.

Copending Application SN: 09/218,340 (Atty Reference RO998–231), Filed Dec. 22, 1998.

Copending application SN: 09/388,313 (Atty Reference RO999–037), filed Sep. 1, 1999.

\* cited by examiner

*Primary Examiner*—Paul Ip
*Assistant Examiner*—Jeffrey Zahn
(74) *Attorney, Agent, or Firm*—Christopher H. Lynt; Matthew J. Bussan; Leslie J. Payne (57) ABSTRACT

A laser driver, e.g., a vertical cavity surface emitting laser (VCSEL) driver, with low duty cycle distortion is provided. An $f_T$ doubler circuit, used as the driver input, has two current sources, and reduces parasitic capacitance which can cause duty cycle distortion. The current sources may be analog or digital sources, the latter being digitally adjustable to provide for digital modulation adjustment. A current mirror circuit with a reference current source is provided for the two current sources.

19 Claims, 10 Drawing Sheets

VERTICAL CAVITY SURFACE EMITTING LASER (VCSEL) DRIVER WITH LOW DUTY CYCLE DISTORTION AND DIGITAL MODULATION ADJUSTMENT

BACKGROUND OF THE INVENTION

1. Field of the Invention

The invention relates to the field of laser driver circuits, and in particular, to a laser driver for vertical cavity surface emitting laser (VCSEL) arrays.

2. Background Information

A laser device called a VCSEL (Vertical Cavity Surface Emitting Laser) is known. Simply put, a VCSEL is a semiconductor laser made of many layers, e.g., 600, which emits light vertically from a lower surface and in a direction parallel to the direction of its optical cavity, as opposed to an edge-emitting type laser structure. VCSEL's have advantages over edge-emitting type structures because, for example, the edge-emitting type lasers must be precisely broken or cleaved individually to form each device during manufacturing. However, with VCSEL's, literally millions of laser devices can be made simultaneously in an etching process.

VCSEL's are currently some of the smallest lasers being produced. There is a relatively new type of VCSEL in development, the QD-VCSEL. The 'QD' signifies the Quantum Dots which are used in the active layer of this type of VCSEL. The QD-VCSEL promises to achieve even further size reductions.

VCSEL's have a range of uses. For example, a specially designed VCSEL has been used to create an optical latch or optical state memory, the VCSEL transitioning and latching in the ON state when an optical input is received. Arrays of such VCSEL's open up possibilities for various massively parallel optical computing applications such as pattern recognition. VCSEL's have data communications applications as well as would be clear to one skilled in the art, for example, as transmitters in parallel optical links. For more information about VCSEL's, see, for example, "LASERS, Harnessing the Atom's Light," Harbison et al., Scientific American Library, 1998, pages 169–177.

Figure 1:
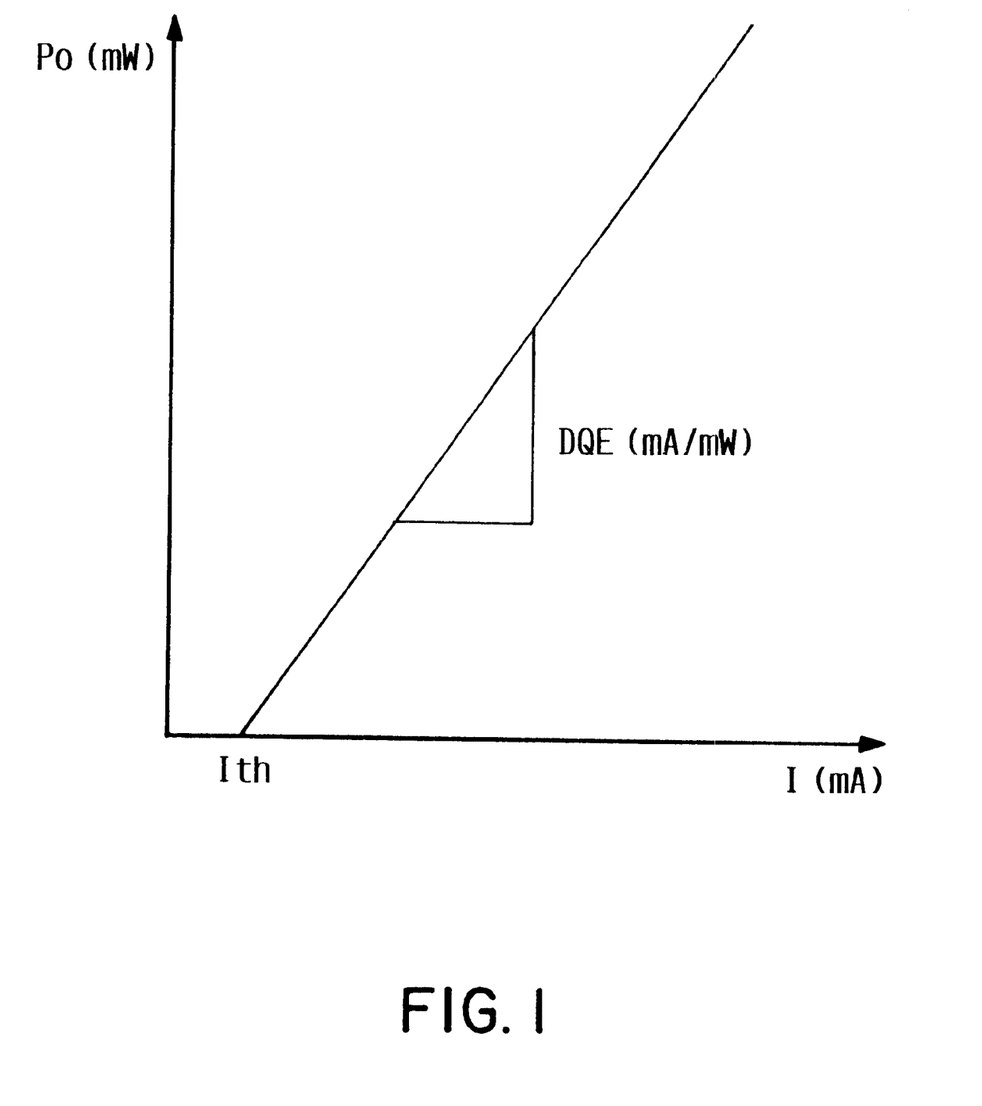
FIG. 1 is a graph which illustrates differential quantum efficiency (DQE) as the slope of output power in milliwatts versus input current in milli-amps above a threshold current, for a typical Vertical Cavity Surface Emitting Laser (VCSEL).

VCSEL arrays are commonly manufactured in a common cathode configuration, i.e., with all the laser cathodes connected together. A graph representing the optical power output $P_O$ in milliwatts (mW) vs. the current input I in milliamps (mA) for a typical VCSEL is shown in FIG. 1. The VCSEL does not begin lasing until the current through it exceeds a certain laser threshold value, shown as $I_{th}$ in the figure. The slope of the curve above $I_{th}$ is commonly referred to in the art as the differential quantum efficiency (DQE) of the VCSEL.

The values of both $I_{th}$ and DQE are process dependent, that is, they are dependent on manufacturing process variations which are, at present, not completely controllable or predictable. Therefore, a method to adjust the current through the VCSEL to compensate for these variations is required.

Figure 2:
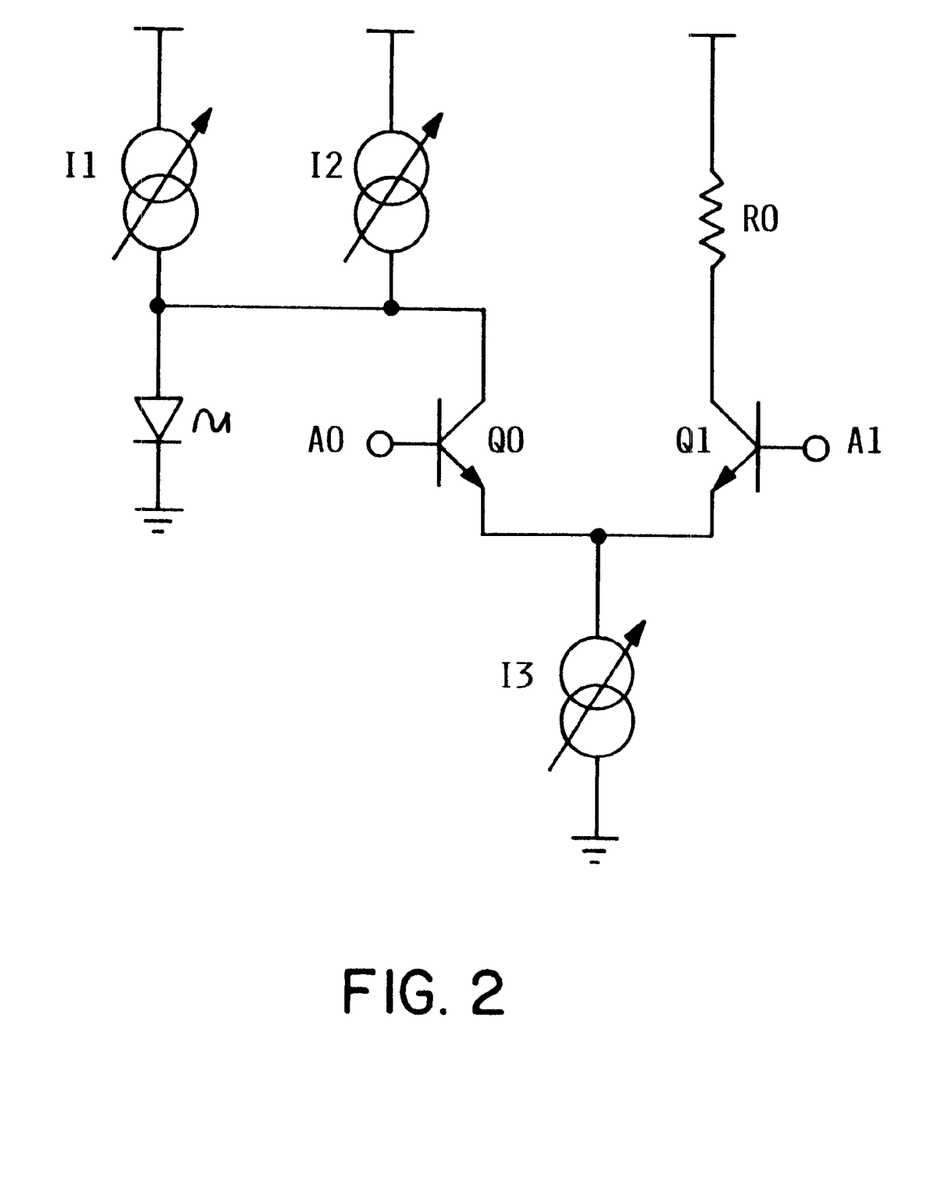
FIG. 2 is a circuit diagram which illustrates a known circuit for driving a common cathode VCSEL array to compensate for process variations.

A method is known to electrically drive a common cathode array as shown in FIG. 2. See, for example, U.S. Pat. No. 4,709,370, Bednarz et al., Nov. 24, 1987.

In particular, Bednarz et al. (U.S. Pat. No. 4,709,370) discloses (Abstract) a driver for driving the anode of a laser diode which includes a constant-current differential switch comprising NPN transistors. Two sources supply constant current into the node where the differential switch drives the laser diode: one source supplies bias current through the laser diode; the second provides a current substantially equal to the constant current through the differential switch. When the transistor, which drives the laser diode, is turned on by a modulating signal applied to its base electrode, the current from the second source flows through it into the current source at the common emitter junction. When this transistor is turned off, the current from the second source flows through the laser diode, adding to the bias current therethrough. Under these circumstances, the total current through the laser diode exceeds the threshold for lasing action and the laser diode is turned on.

Battjes (U.S. Pat. No. 3,633,120) discloses (Abstract) an amplifier circuit for increasing current gain at high frequencies which includes first and second pairs of transistors, wherein the outputs of the transistor pairs are coupled in parallel while a common input current is provided in series to the four transistors. The circuit substantially doubles the current gain achieved at certain high frequencies. This circuit is referred to herein as an $f_T$ doubler.

Returning to the FIG. 2 circuitry, the variable current source I1 supplies a DC current equal to the $I_{th}$ (threshold) current of the VCSEL. Variable current source I2 supplies a DC current equal to the desired modulation current. Variable current source I3 supplies a DC current equal to the current of I2. When signal A0 is high and signal A1 is low, current from current source I3 is directed through Q0. Since the current from current source I3 is equal to the current from current source I2, only the threshold current from current source I1 will be flowing in the VCSEL at this time.

When signal A0 is low and signal A1 is high, the current from current source I3 is directed through Q1. Therefore, a current equal to the sum of the current from current sources I1 and I2 will be flowing in the VCSEL.

In reality, it is desired that the collector current of Q0 equal the current of I2. Mismatches between I2 and I3, and the base current of Q0, cause the collector current of Q0 to not equal I2. The base current 'steals' some of the I3 current, since I3 is the emitter current, and the collector current is the emitter current less the base current.

However, a mismatch between current sources I2 and I3 would cause the respective currents to be unequal and lead to problems. Some causes for current source mismatch include process variations/tolerances, $V_{be}$ (voltage base to emitter) mismatches in bipolar transistor devices, and $V_T$ (threshold voltage) in field effect transistor devices If the current from current source I3 is greater than the current from current source I2, when Q0 is on and Q1 is off, some of I1 will be diverted away from the VCSEL and through Q0, so that less current will flow through the VCSEL. This causes the low level current flowing in the VCSEL to fall below the threshold current $I_{th}$. This will cause a turn on delay, since the VCSEL is not at $I_{th}$ when the turn on signal is first applied. The turn on delay results in what is referred to as 'duty cycle distortion' in the optical output waveform from the VCSEL, and is a potential source of skew, i.e., a timing misalignment, between channels in a multi-channel system with a VCSEL array.

On the other hand, if the current from current source I3 is less than the current from current source I2, a current flows through the VCSEL greater than $I_{th}$ when Q0 is on. In this case, the average optical power out of the VCSEL will increase beyond desired levels, possibly causing an overpowering condition. The effect is that a current (I1+(I2−I3) greater than the laser threshold current flows through the laser when it is supposed to be at the threshold.

Therefore, to provide a way to compensate for these possible problems, the current source I3 should be adjustable independent of current source I2.

Figure 3:
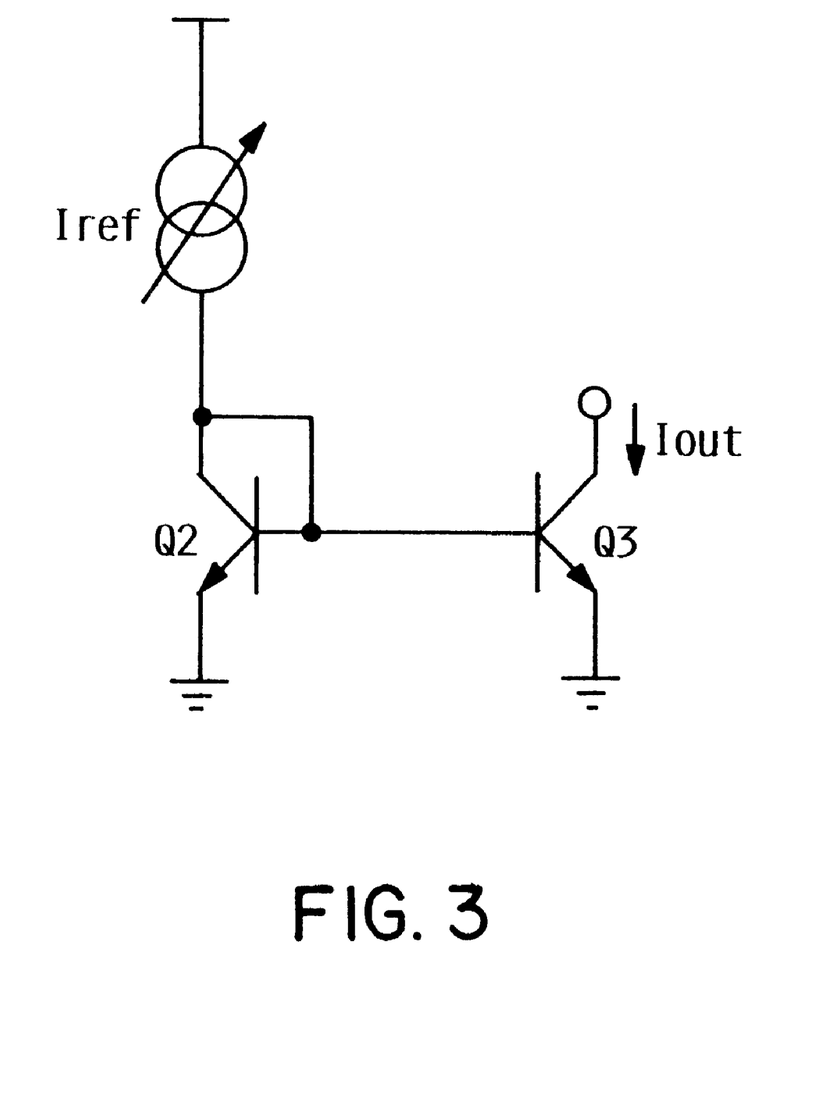
FIG. 3 is a circuit diagram which illustrates a common implementation of the current source I3 of FIG. 2.

A common implementation of current source I3 is shown in schematic form in FIG. 3. It includes a reference current source Iref and a current mirror including transistors Q2 and Q3. Current Iref controls current Iout from Q3 by the connection with Q2. (Note that in the circuits depicted herein, the current is drawn according to so-called 'conventional current'.)

Typically, VCSEL's have DQE's in the range of 0.1 mW/mA to 0.6 mW/mA. This causes a 6 to 1 ratio in modulation current necessary in current sources I2 and I3, since the DQE is directly proportional to the modulation current through the laser provided by the current sources I2 and I3 (recall that the slope of the current curve above $I_{th}$ is the differential quantum efficiency 'DQE').

Figure 4:
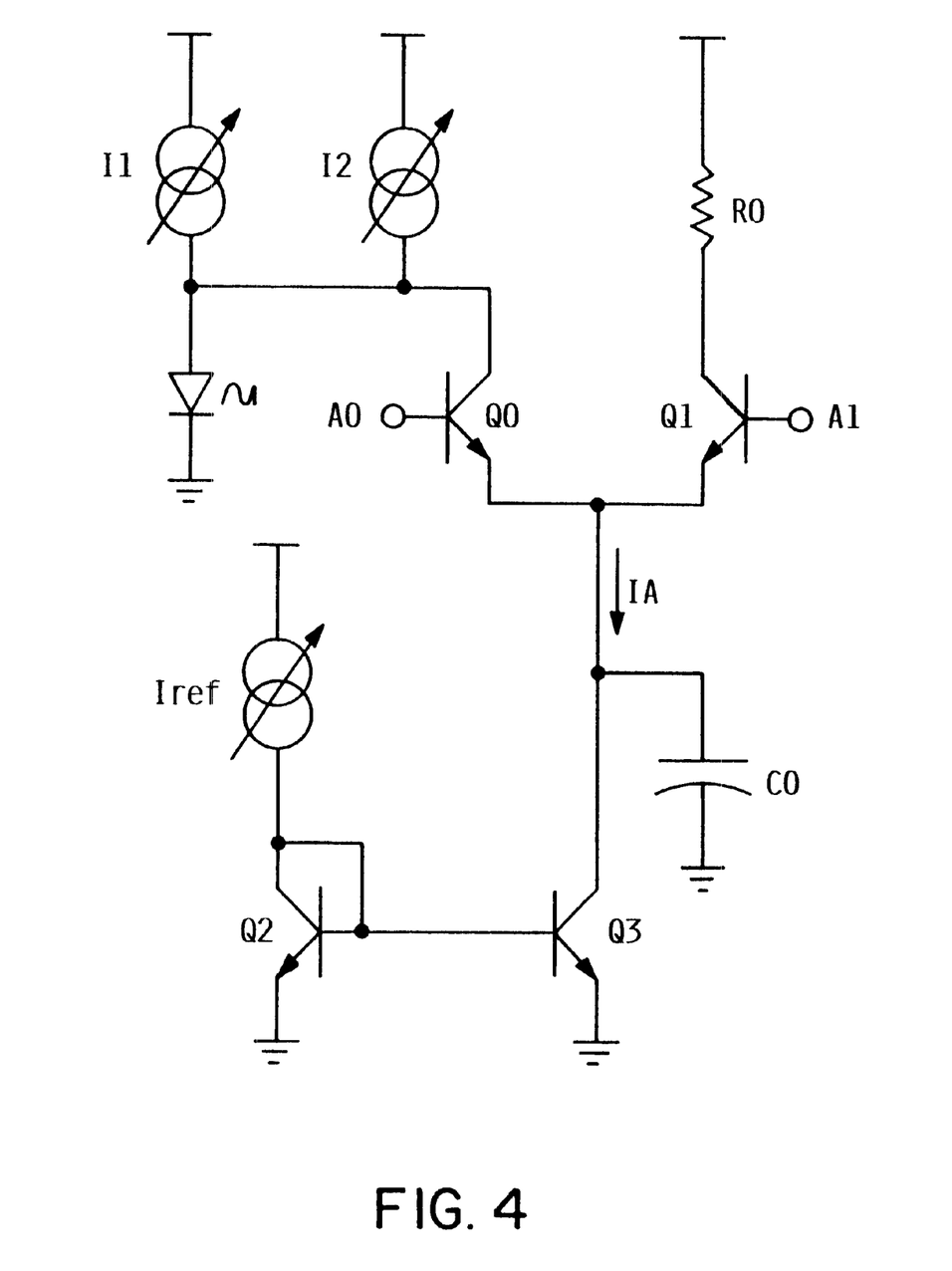
FIG. 4 is a circuit diagram which illustrates the a driver circuit of FIG. 2 with the current source of FIG. 3 and showing an equivalent capacitance due to a transistor of the current source.

To handle the large current necessary with a low DQE to obtain the needed output power, transistor Q3 of current source I3 (FIG. 3) needs to be physically large. However, this results in a large equivalent (parasitic) capacitance. FIG. 4 illustrates the current source circuit of FIG. 3 connected as current source I3 of FIG. 2. The large equivalent capacitance of Q3, represented by C0 in FIG. 4, is connected between ground and the common emitter node (the node where the emitters of transistors Q0 and Q1 are connected). Such a capacitance can cause timing problems, as will be explained.

Figure 5:
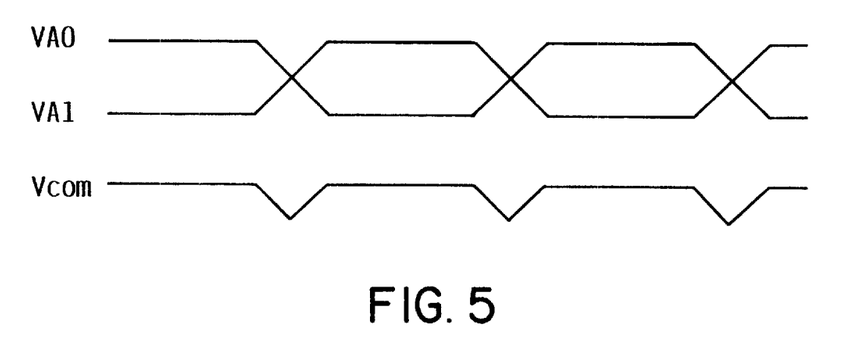
FIG. 5 is a timing diagram which graphically illustrates the effect of the equivalent capacitance of FIG. 4 on a common node voltage when the driver circuit of FIG. 4 is switched.

FIG. 5 is a timing chart which illustrates the effect this equivalent capacitance C0 of Q3 has on the driver circuit operation. The signals A0 and A1 are represented as voltages VA0 and VA1, respectively. On switching edges of the signals A0 and A1, the common emitter node voltage Vcom temporarily decreases as shown in the lower trace of FIG. 5.

When the common emitter node voltage Vcom decreases, current must be sinked out of the equivalent capacitance C0. However, the only source for this 'delta' current is Q3. Therefore, the source current (IA in FIG. 4) temporarily droops causing both IQ0 and IQ1 to droop.

Figure 6:
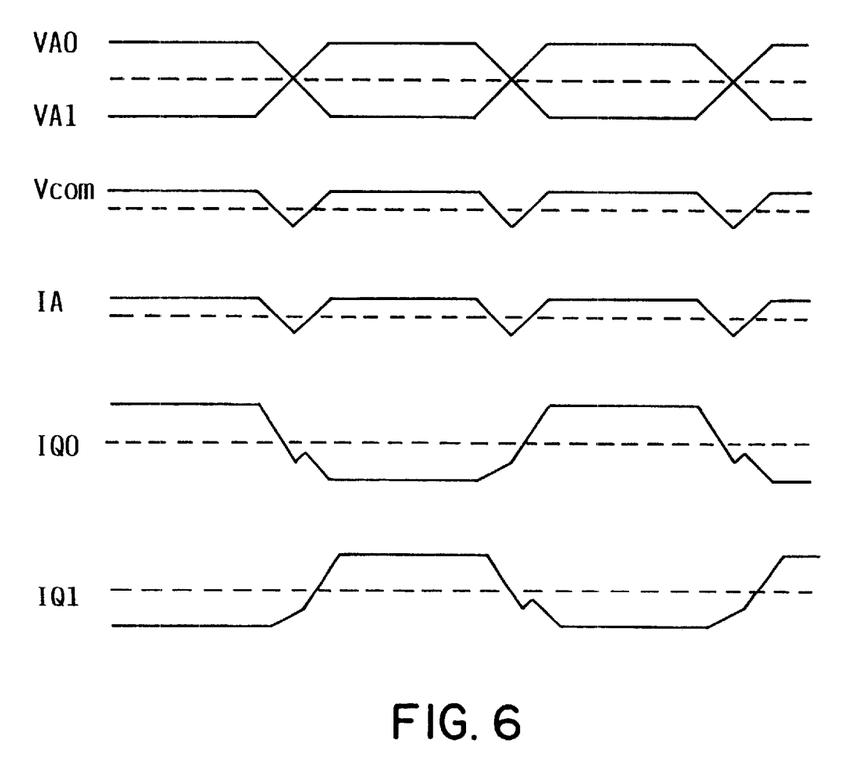
FIG. 6 is a timing diagram which graphically illustrates the effect of the equivalent capacitance of FIG. 4 and the common node voltage effect on currents in the driver circuit.

On the other hand, after the switching is completed, current must be sourced back into the equivalent capacitance C0. The only source for this additional current is again the current IA. Therefore, the current through transistor Q0 (IQ0) or through transistor Q1 (IQ1) temporarily increases to provide this current IA. A graphical representation of this phenomena is shown in the timing diagram of FIG. 6.

These temporary decreases and increases in the currents IQ0 and IQ1 due to the equivalent capacitance of current source transistor Q3 introduce an undesirable duty cycle distortion in the output optical waveform of the VCSEL.

Therefore, a need exists for driver circuitry which compensates for this duty cycle distortion.

Copending related application Ser. No. 09/429,282, filed Oct. 28, 1999, entitled "OPTICAL POWER ADJUSTMENT CIRCUITS FOR PARALLEL OPTICAL TRANSMITTERS" assigned to the same assignee as the present application, provides an open loop method to adjust the optical power level to compensate for temperature and process variations, particularly, in VCSEL arrays. In an embodiment disclosed therein, optical power adjustment circuitry for parallel optical transmitters is provided which can independently digitally adjust the threshold current and modulation current for each VCSEL in an array, as well as provide a global temperature coefficient for all the VCSEL's in the array which can be digitally set.

SUMMARY OF THE INVENTION

It is, therefore, a principle object of this invention to provide a method and apparatus for a vertical cavity surface emitting laser (VCSEL) driver with low duty cycle distortion.

It is another object of the invention to provide a method and apparatus with digital modulation adjustment.

It is another object of the invention to provide a method and apparatus that solves the above mentioned problems.

These and other objects of the present invention are accomplished by the method and apparatus disclosed herein.

According to an aspect of the invention, a laser driver for use in the modulation of a laser device includes a first means for providing a threshold laser current, a second means for providing a laser current equal to a desired modulation current, and a third means for providing the desired modulation current in response to input modulation signals. The third means is further for reducing duty cycle distortion during the modulation of the laser device.

According to an aspect of the invention, the driver is for modulating the laser device between an on and a threshold/off state.

According to another aspect of the invention, in the threshold/off state, the driver operates so that only the threshold current flows through the laser, and in the on state, a sum of the threshold current and the modulation current flows through the laser.

According to another aspect of the invention, the first means comprises a first variable current source which provides the threshold laser current. The second means comprises a second variable current source which provides the laser current equal to a desired modulation current. The third means comprises an $f_T$ doubler circuit which provides the desired modulation current.

According to another aspect of the invention, the $f_T$ doubler circuit includes a first and a second differential pair of transistors, and a variable current source. The first and second differential pairs of transistors receive input signals which cause modulation of the laser device. The current source includes two current source transistors, a diode connected transistor, and a reference current source.

According to another aspect of the invention, the laser device is a vertical cavity surface emitting laser (VCSEL), or an edge emitting laser device.

According to another aspect of the invention, the current adjusting means comprises digital to analog converter means for receiving digital adjustment bits and adjusting the respective currents accordingly.

According an aspect of the invention, there is provided a laser driver with digital modulation adjustment which includes a first variable current source which provides a threshold laser current, a second variable current source which provides a laser current equal to a desired modulation current, and an $f_T$ doubler circuit which provides the desired modulation current in response to input modulation signals. The $f_T$ doubler circuit includes a first and a second differential pair of transistors, and a third variable current source. The first and second differential pairs of transistors receive input signals which cause modulation of the laser device. The third current source includes two first digital to analog converters which provide currents proportional to input bits, to the first and second differential pairs of transistors, and a current mirror circuit including a digital to analog converter (W1/L, W4/L2) and a reference current source.

These and other aspects of the invention will become apparent from the detailed description set forth below.

DETAILED DESCRIPTION OF THE PREFERRED EMBODIMENT(S)

The invention will now be described in more detail by way of example with reference to the embodiment(s) shown in the accompanying figures. It should be kept in mind that the following described embodiment(s) is/are only presented by way of example and should not be construed as limiting the inventive concept to any particular physical configuration.

Figure 7:
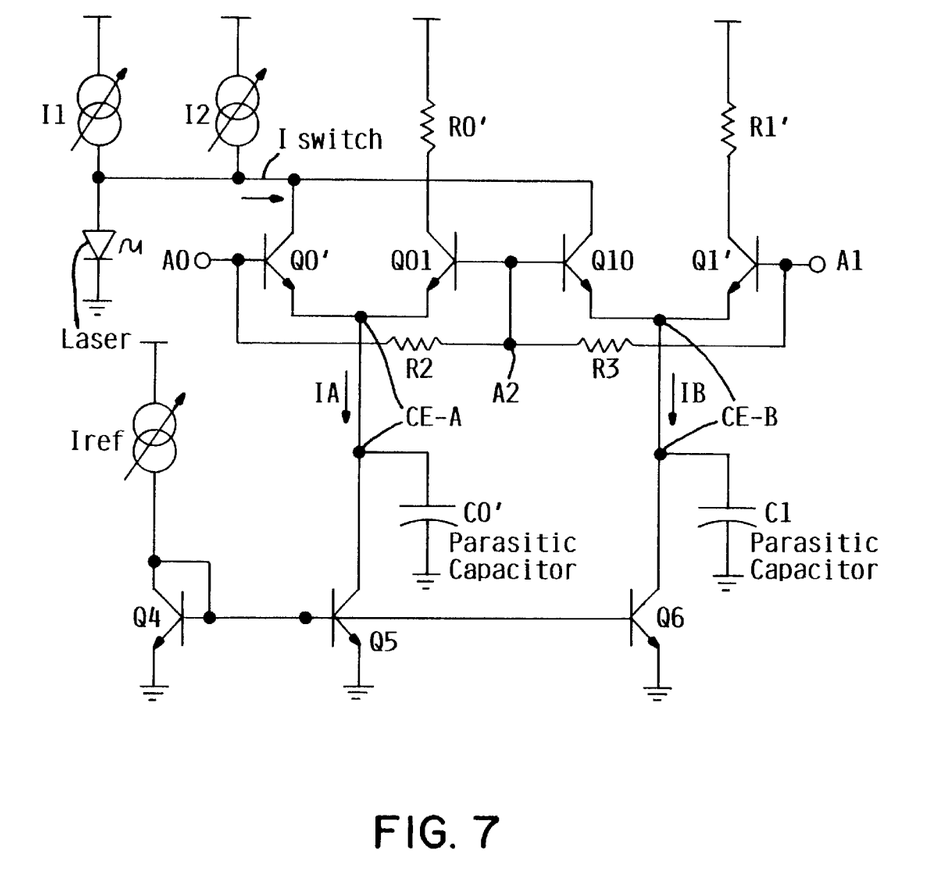
FIG. 7 illustrates a driver circuit including circuitry which decreases duty cycle distortion, according to an exemplary embodiment of the invention.

FIG. 7 illustrates a driver circuit for a laser (LASER), e.g., a VCSEL or an edge emitting laser, including circuitry which decreases duty cycle distortion, according to an exemplary embodiment of the invention. In particular, to compensate for the duty cycle distortion problem with the prior circuitry, Q0, Q1, and Q3 of FIG. 2 are replaced by an $f_T$ doubler as shown in FIG. 7.

As would be known by one skilled in the art, an "$f_T$ doubler" is a circuit arrangement which doubles the frequency at which the gain is unity. See for Example, the Battjes patent (U.S. Pat. No. 3,633,120) mentioned above, and "SA 19.1: A 10 Gb/s Si-Bipolar TX/RX Chipset for Computer Data Transmission" by Richard C. Walker et al., ISSCC98/SESSION19/MULTI-GIGAHERTZ SERIAL DATA/PAPER SA 19.1, Feb. 7, 1998.

The illustrated $f_T$ doubler includes a bipolar (Bipolar Junction Transistor) differential pair Q0'/Q01, a BJT differential pair Q10/Q1', a current source Q5, and a current source Q6. The reference current source Iref and current mirror transistors Q2 and Q3 of FIG. 4, have been replaced by the reference current source Iref, Q4, Q5 and Q6.

Splitting the differential pair of transistors Q0 and Q1 of FIG. 4 into two differential pairs (Q0'/Q01 and Q10/Q0'), and splitting Q3 of FIG. 4 into two current source transistors (Q5 and Q6, both tied to Q4 and Iref), reduces the parasitic capacitance (C0 in FIG. 4, to C0' and C1 in FIG. 7) on the common emitter nodes CE-A, CE-B of the differential pairs (Q0', Q01 and Q1', Q10) in FIG. 7. This, in turn, reduces the magnitude of decreases in source current IA and IB through these nodes (CE-A, CE-B) in FIG. 7, and therefore, the short up-spike in current in Q0' is reduced when the switching is completed. Consequently, duty cycle distortion is advantageously decreased.

Also, the transistors connected directly to the input signals A0 and A1 in the arrangement of FIG. 7, i.e., transistors Q0' and Q1' respectively, can be smaller than the differential pair transistors Q0/Q1 of FIG. 4 because the current flowing in them has been cut in half. Thus, feed through current spikes through the parasitic capacitance base to collector of Q0', which cause turn on delay in the LASER, e.g., an edge emitting laser or a VCSEL, are reduced, because the base to collector capacitance has been reduced.

Additionally, the rise time of the current in transistor Q10, current IQ10, is slow compared to that of the current in transistor Q0, current IQ0, because the base of Q10 is driven by a DC voltage provided by the resistive divider R2, R3 coupled to the inputs A0, A1, and together at node A2. Resistances R2 and R3 are relatively large and of equal value, to reduce their effect on rise and fall time of the current in the LASER, e.g., an edge emitting laser or a VCSEL. This makes the voltage at node A2 equal the average voltage on the base of Q0' (and Q1').

This current IQ10 with a slow rise time is added to IQ0 to become the current that is subtracted or not subtracted from the LASER. This slow rise time of IQ10, when added to the fast rise time of IQ0 tends, to dampen any current spikes in the LASER.

Therefore, the reduced capacitance on the common emitter nodes, and the addition of fast and slow rise times, reduces the duty cycle distortion compared to the circuit of FIG. 4.

Figure 8:
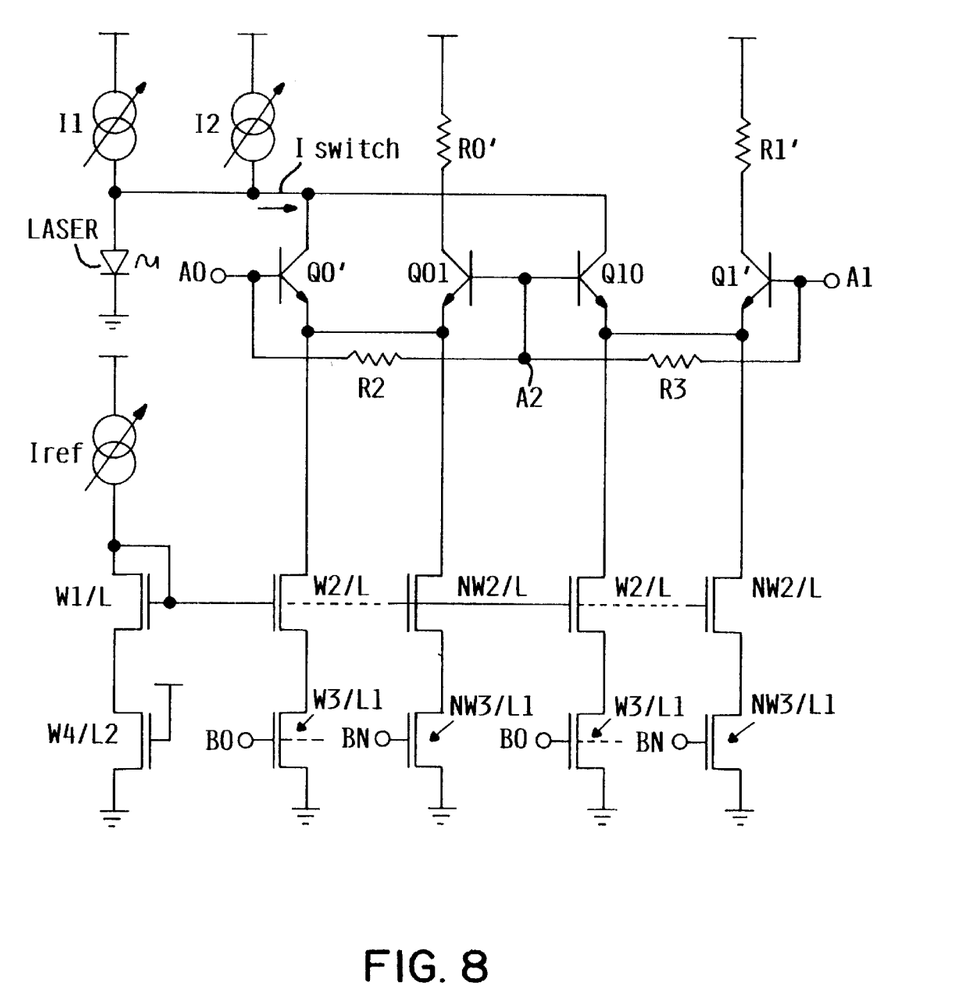
FIG. 8 illustrates a driver circuit based on that of FIG. 7, further including circuitry which provides for independent adjustment of currents to adjust for current source mismatches, according to an exemplary embodiment of the invention.

FIG. 8 illustrates a driver circuit based on the driver of FIG. 7, further including circuitry which provides for independent adjustment of currents to adjust for current source mismatches, according to an exemplary embodiment of the invention. In particular, the $f_T$ doubler current sources, Q5 and Q6, of FIG. 7 can be constructed from two N-bit digital to analog converters (DAC's) to incorporate a way to independently adjust the current in the differential pairs (Q0'/Q01 and Q10/Q1') to compensate for current source mismatches, as were described above. FIG. 8 shows an example of a circuit incorporating the $f_T$ doubler and independently adjustable current DAC's.

Regarding the independently adjustable current DAC's of FIG. 8 which replace the $f_T$ doubler current sources, these are illustrated as respective sets of N digital input gates W3/L1 . . . NW3/L1, and N current output gates W2/L . . . NW2/L. Bits B0 . . . BN on the input gates adjust the output current according to the digital value input. The available current adjustment resolution depends on the number N, i.e., the number of sets of input and output gates.

The digital to analog converter and reference current source Iref function as a digitally adjustable current mirror circuit to make the current Iswitch equal to the modulation current in I2.

Figure 9:
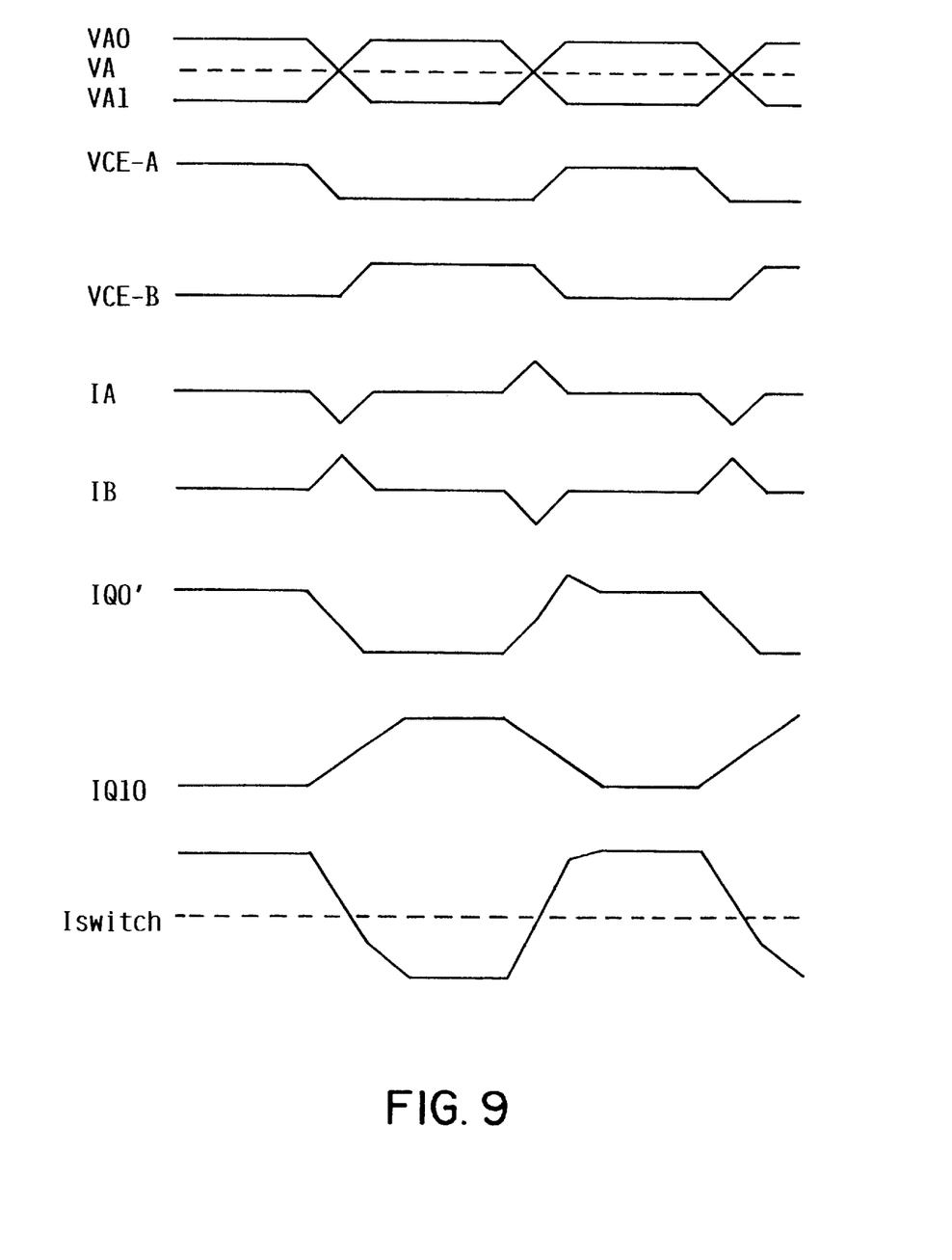
FIG. 9 is a timing diagram which graphically illustrates the improvement in the effect of the equivalent capacitance on currents in the driver circuit according to an embodiment of the invention.

FIG. 9 is a timing diagram that shows the improvement achieved with the exemplary embodiment of the invention, i.e., a reduction in distortion due to the parasitic capacitance.

Figure 10A:
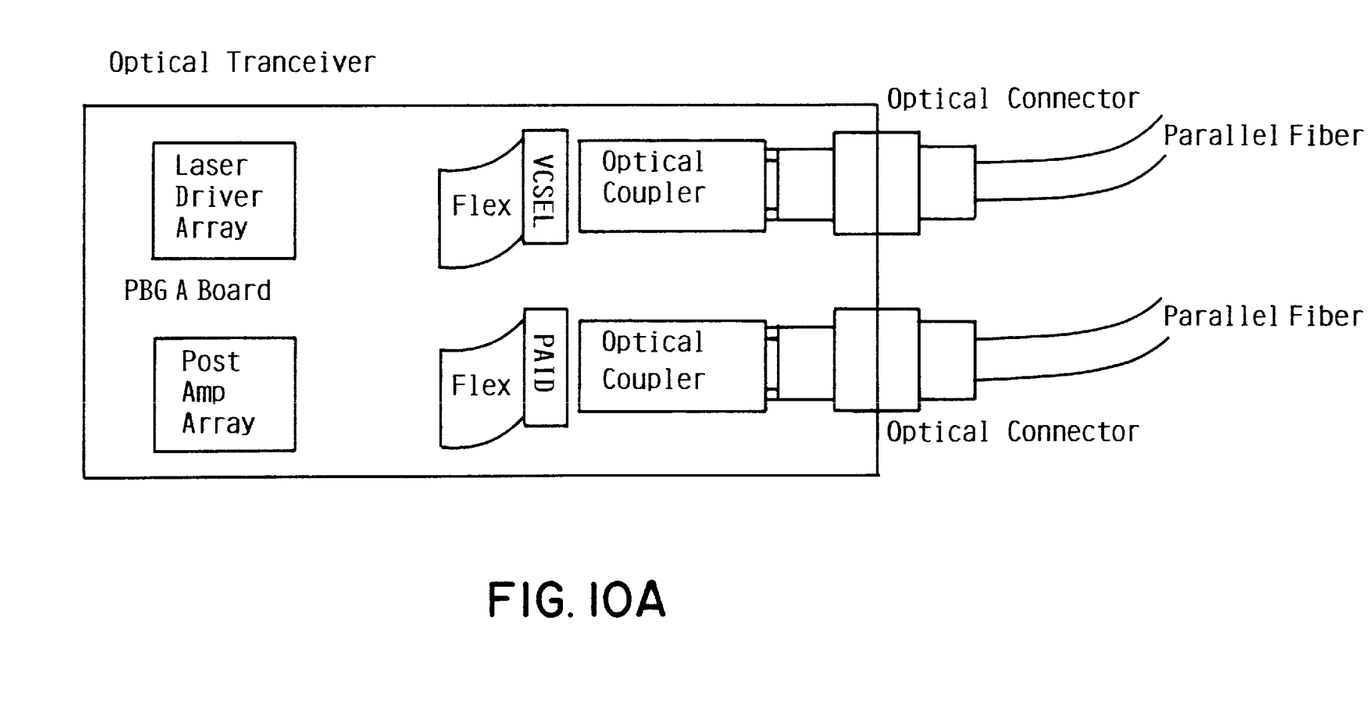
FIGS. 10a and 10b illustrate an application of the invention in an optical transceiver and a system using the transceiver, respectively.
Figure 10B:
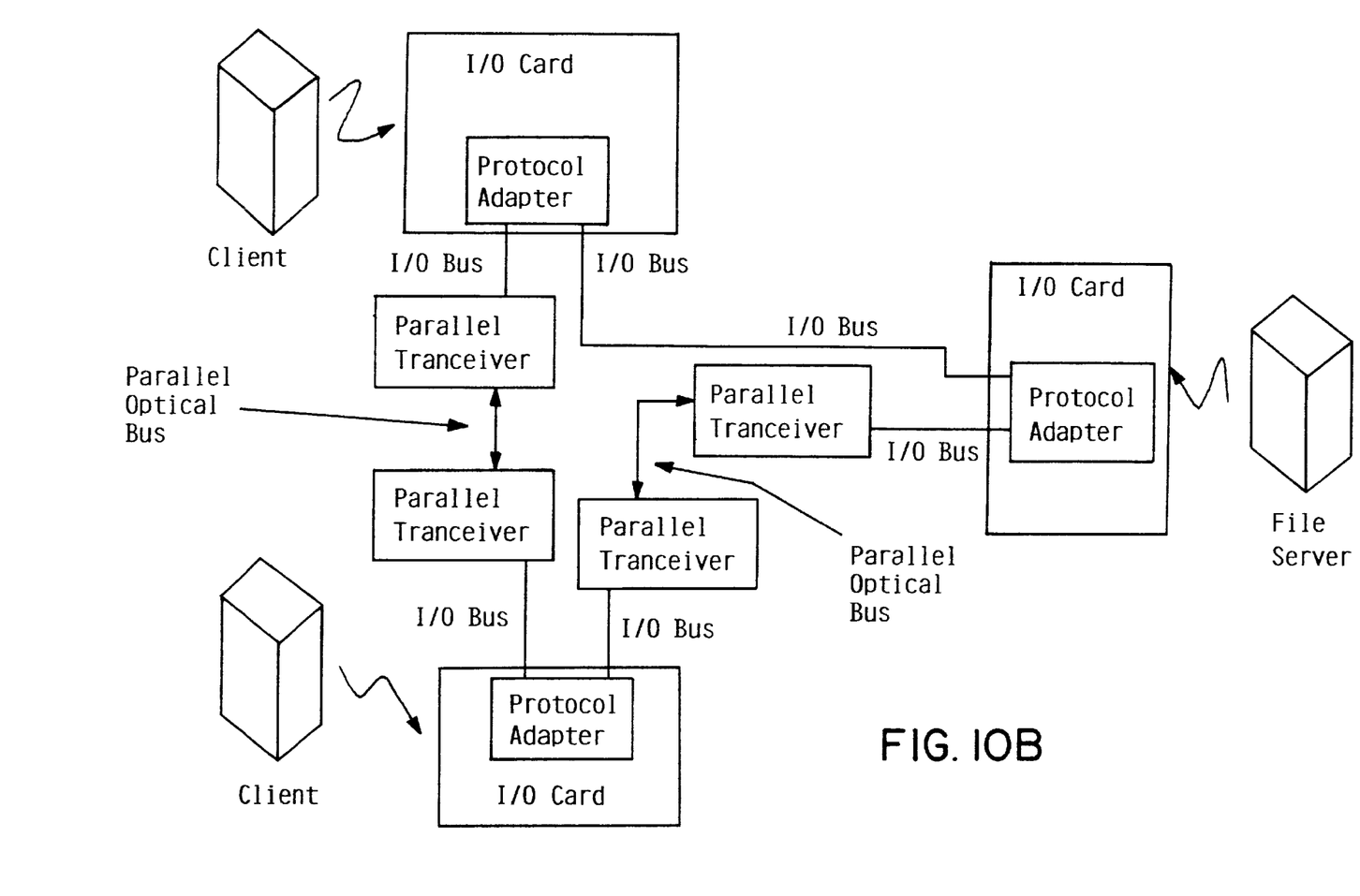

FIGS. 10a and 10b illustrate an application of the invention in an optical transceiver and a system using the transceiver, respectively. The optical transceiver is shown schematically as functional blocks on a PBGA board. One of the blocks is labeled Laser Driver Array, and it is in this block that the exemplary embodiment of the invention would be implemented. The Laser Driver Array is coupled to the VCSEL's by a flexible cable. The optical output of the VCSEL's is coupled into a parallel fiber by an optical connector and optical coupler. The transceiver has a pre-amp integrated detector (PAID) which receives optical input from a parallel fiber through another optical connector and optical coupler. The PAID is coupled to a Post Amp Array by another flexible cable.

A system using four transceivers, such as the transceiver just described, is shown in FIG. 10b. In the illustrated system, there are two client boxes and a file server, each having an input/output (I/O) card with a protocol adapter coupling the device to a respective I/O bus. One client is connected to the file server on an I/O bus directly, i.e., electrically. The other client is connected to the file server via a parallel optical bus having transceivers at each end which are coupled to the respective I/O buses. The two clients are connected optically in the same manner.

Of course, the disclosed and described invention is not limited in application to the just described transceiver and system using the transceiver.

It will be apparent to one skilled in the art that the manner of making and using the claimed invention has been adequately disclosed in the above-written description of the preferred embodiment(s) taken together with the drawings.

It will be understood that the above described preferred embodiment(s) of the present invention are susceptible to various modifications, changes, and adaptations, and the same are intended to be comprehended within the meaning and range of equivalents of the appended claims.

For example, although the exemplary embodiment is illustrated as using bipolar transistors, it is not limited thereto. Further, although the exemplary embodiment is described as for. use with a VCSEL or VCSEL array, it is applicable to edge emitting lasers, or other devices, as well, where duty cycle distortion is a problem, as would be recognized by one skilled in the art.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

What is claimed is:

1. A laser driver for use in the modulation of a laser device comprising:
   first means for providing a threshold laser current;
   second means operably associated with the first means for providing a laser current equal to a desired modulation current; and
   third means for providing the desired modulation current in response to input modulation signals and for reducing duty cycle distortion during the modulation of the laser device;
   wherein the first, second and third means are commonly connected to an input of the laser device.

2. The laser driver according to claim 1, wherein the driver is for modulating the laser device between an on and a threshold/off state.

3. The laser driver according to claim 2, wherein:
   in the threshold/off state, the driver operates so that only the threshold current flows through the laser; and
   in the on state, a sum of the threshold current and the modulation current flows through the laser.

4. The laser driver according to claim 3:
   wherein the first means comprises a first variable current source which provides the threshold laser current;
   wherein the second means comprises a second variable current source which provides the laser current equal to a desired modulation current;
   wherein the third means comprises an $f_T$ doubler circuit which provides the desired modulation current, including:
      a first differential pair of transistors,
      a second differential pair of transistors, and
      a third variable current source;
   wherein the first differential pair of transistors and the second differential pair of transistors receive input signals which cause modulation of the laser device; and
   wherein the third current source includes two current source transistors, a diode connected transistor, and a reference current source.

5. The laser driver according to claim 4, wherein the laser device comprises a vertical cavity surface emitting laser.

6. The laser driver according to claim 4, wherein the transistors comprise bipolar transistors.

7. The laser driver according to claim 4, wherein the laser device comprises an edge emitting laser.

8. The laser driver according to claim 7, wherein the current adjusting means comprises digital to analog converter means for receiving digital adjustment bits and adjusting the respective currents accordingly.

9. A laser driver with digital modulation adjustment, comprising:
   a first variable current source which provides a threshold laser current;
   a second variable current source which provides a laser current equal to a desired modulation current;
   an $f_T$ doubler circuit which provides the desired modulation current in response to input modulation signals, the $f_T$ doubler circuit comprising:
      a first differential pair of transistors,
      a second differential pair of transistors,
      a third variable current source;
   wherein the first differential pair of transistors and the second differential pair of transistors receive input signals which cause modulation of the laser device; and
   wherein the third variable current source includes two first digital to analog converters which provide currents proportional to input bits, to the first differential pair of transistors and the second differential pair of transistors, and a current mirror circuit including a digital to analog converter and a reference current source.

10. A method of modulating a laser device with a laser driver, comprising:
    providing a threshold laser current;
    providing a laser current equal to a desired modulation current; and
    providing the desired modulation current in response to input modulation signals, and reducing duty cycle distortion during the modulation of the laser device;

wherein the steps of providing a threshold laser circuit, a laser current equal to a desired modulation current; and, the desired modulation current provide a commonly connected output to the laser driver.

11. The method according to claim 10, wherein a first variable current source provides the threshold laser current;

a second variable current source provides the laser current equal to a desired modulation current;

and an $f_T$ doubler circuit provides the desired modulation current in response to input modulation signals and reduces duty cycle distortion during the modulation of the laser device.

12. The method according to claim 11, wherein the $f_T$ doubler circuit comprises:

a first differential pair of transistors, a second differential pair of transistors, a third variable current source;

wherein the first differential pair of transistors and the second differential pair of transistors receive input signals which cause modulation of the laser device; and wherein the third variable current source includes two first digital to analog converters which provide currents proportional to input bits, to the first differential pair of transistors and the second differential pair of transistors, and a current mirror circuit including a digital to analog converter and a reference current source.

13. A system comprising a parallel optical transmitter having a plurality of laser output devices, and a parallel optical receiver having a plurality of optical input devices;

wherein the parallel optical transmitter has a laser driver including:

first means for providing a threshold laser current;

second means operably associated with the first means for providing a laser current equal to a desired modulation current; and third means for providing the desired modulation current in response to input modulation signals and for reducing duty cycle distortion during the modulation of the laser device;

wherein the first, second and third means are commonly connected to an input of the laser device.

14. The system according to claim 13, wherein the parallel optical receiver and the parallel optical transmitter are packaged together as a parallel optical transceiver.

15. The system according to claim 14, wherein there are a plurality of parallel optical transceivers, pairs of which are coupled together by a respective parallel optical bus.

16. The system according to claim 15, wherein the parallel optical bus comprises a parallel optical fiber, and the plurality of optical output devices comprise vertical cavity surface emitting lasers.

17. The system according to claim 13, wherein the first means comprises a first variable current source which provides the threshold laser current;

wherein the second means comprises a second variable current source which provides the laser current equal to a desired modulation current;

wherein the third means comprises an $f_T$ doubler circuit which provides the desired modulation current in response to input modulation signals and reduces duty cycle distortion during the modulation of the laser device.

18. The system according to claim 17, wherein the $f_T$ doubler circuit comprises:

a first differential pair of transistors, a second differential pair of transistors, a third variable current source;

wherein the first differential pair of transistors and the second differential pair of transistors receive input signals which cause modulation of the laser device; and wherein the third variable current source includes two first digital to analog converters which provide currents proportional to input bits, to the first differential pair of transistors and the second differential pair of transistors, and a current mirror circuit including a digital to analog converter and a reference current source.

19. The system according to claim 18, wherein the laser device comprises a vertical cavity surface emitting laser.

\* \* \* \* \*